US011860973B2

United States Patent
Moradian et al.

(10) Patent No.: US 11,860,973 B2
(45) Date of Patent: Jan. 2, 2024

(54) METHOD AND SYSTEM FOR FORELINE DEPOSITION DIAGNOSTICS AND CONTROL

(71) Applicant: Applied Materials, Inc., Santa Clara, CA (US)

(72) Inventors: Ala Moradian, Sunnyvale, CA (US); Martin A. Hilkene, Gilroy, CA (US); Zuoming Zhu, Sunnyvale, CA (US); Errol Antonio C. Sanchez, Santa Clara, CA (US); Bindusagar Marath Sankarathodi, San Jose, CA (US); Patricia M. Liu, Saratoga, CA (US); Surendra Singh Srivastava, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 512 days.

(21) Appl. No.: 17/081,459

(22) Filed: Oct. 27, 2020

(65) Prior Publication Data
US 2022/0129698 A1   Apr. 28, 2022

(51) Int. Cl.
*G06K 9/62* (2022.01)
*G06F 18/214* (2023.01)
(Continued)

(52) U.S. Cl.
CPC ........... *G06F 18/214* (2023.01); *G06F 18/24* (2023.01); *G06N 20/00* (2019.01); *H01L 21/0206* (2013.01); *H01L 21/02019* (2013.01)

(58) Field of Classification Search
CPC ....... G06F 18/214; G06F 18/24; G06N 20/00; H01L 21/02019; H01L 21/0206;
(Continued)

(56) References Cited

U.S. PATENT DOCUMENTS

| 11,031,215 B2 | 6/2021 | Drewery et al. |
| 2007/0189356 A1* | 8/2007 | Pettit ................... C23C 16/4412 374/7 |

(Continued)

FOREIGN PATENT DOCUMENTS

| JP | H11162939 A | 6/1999 |
| JP | 2007311393 A | 11/2007 |
| KR | 10-2019-0090414 A | 8/2019 |

OTHER PUBLICATIONS

PCT/US2021/051531, International Search Report and Written Opinion dated Jan. 11, 2022, 11 pages.

*Primary Examiner* — Tuan H Nguyen
(74) *Attorney, Agent, or Firm* — Patterson + Sheridan, LLP

(57) ABSTRACT

Systems, apparatus, and methods are disclosed for foreline diagnostics and control. A foreline coupled to a chamber exhaust is instrumented with one or more sensors, in some embodiments placed between the chamber exhaust and an abatement system. The one or more sensors are positioned to measure pressure in the foreline as an indicator of conductance. The sensors are coupled to a trained machine learning model configured to provide a signal when the foreline needs a cleaning cycle or when preventive maintenance should be performed. In some embodiments, the trained machine learning predicts when cleaning or preventive maintenance will be needed.

20 Claims, 4 Drawing Sheets

(51) Int. Cl.
 *H01L 21/02* (2006.01)
 *G06N 20/00* (2019.01)
 *G06F 18/24* (2023.01)

(58) Field of Classification Search
 CPC ........ H01L 21/02; G06K 9/62; G06K 9/6256; G06K 9/6267
 See application file for complete search history.

(56) References Cited

U.S. PATENT DOCUMENTS

2007/0215044 A1 9/2007 Yamazawa
2015/0196002 A1* 7/2015 Friesth .................. C12M 43/00
 315/297

* cited by examiner

METHOD AND SYSTEM FOR FORELINE DEPOSITION DIAGNOSTICS AND CONTROL

BACKGROUND

Field

Embodiments of the present invention generally relate to foreline diagnostics and control, and more particularly, to predictive foreline diagnostics.

Description of the Related Art

Semiconductor substrates are processed for a wide variety of applications, including the fabrication of devices and microdevices. These processes can produce high quality films on substrates under certain processing conditions, including temperature, pressure, and precursor flow rates, within processing chambers. Any variations in process parameters may result in film thickness and profile variation.

Although the goal of film deposition is for the majority of deposited material to be deposited on the substrate, processing chamber components, chamber exhaust, and foreline components can also get coated. To maintain process conditions from wafer to wafer, a cleaning recipe is executed to etch unintended coatings from chamber and foreline components. However, even the cleaning process may result in unintended, and sometimes flammable, coatings in the foreline.

In conventional approaches, a cleaning recipe is run after every wafer, or after a certain number of wafers, without measuring the amount of deposition in the foreline. This may result in cleaning too often, that can be a waste of cleaning resources and time, or not cleaning enough, resulting in an unreliable change in process parameters and potentially dangerous deposition in the foreline.

What is needed are systems and methods to overcome the shortcomings of conventional approaches.

SUMMARY

The present disclosure generally relates to systems, apparatus, and methods for foreline diagnostics and control. A foreline coupled to a chamber exhaust is instrumented with one or more sensors, in some embodiments placed between the chamber exhaust and an abatement system. The one or more sensors are positioned to measure pressure in the foreline as an indicator of conductance. The sensors are coupled to a trained machine learning model configured to provide a signal when the foreline needs a cleaning cycle or when preventive maintenance should be performed. In some embodiments, the trained machine learning predicts when cleaning or preventive maintenance will be needed.

In one embodiment, a system for foreline diagnostics and control is disclosed, that includes a foreline coupled to an exhaust of a processing chamber, a first sensor positioned to measure deposition build-up in the foreline, and a build-up monitor coupled to the first sensor, the build-up monitor comprising a trained machine learning (ML) model and configured to generate an output indicating deposition build-up and trigger a corrective action when the indicated deposition build-up is at or above a build-up threshold.

In another embodiment, a computer-readable medium comprising instructions for executing a method for foreline deposition diagnostics. The method includes receiving build-up data from at least one the plurality of sensors, providing the build-up data to a build-up monitor comprising a trained machine learning (ML) model configured to generate an output indicating deposition build-up, and generating a corrective action based on the output when the build-up data is indicated to be at a build-up threshold.

In another embodiment, a method for monitoring deposition build-up in a foreline of a processing system is disclosed, including receiving sensor data from one or more sensors coupled to a foreline of a semiconductor processing system, processing the sensor data with a trained machine learning model to estimate a build-up, and triggering a corrective action corresponding to the estimated build-up of the trained machine learning model.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Systems, apparatus, and methods are disclosed for monitoring deposition build-up in processing system foreline, using cumulative historical process and clean data, and real-time data from one or more sensors place along the foreline.

During the processing of a semiconductor substrate, such as by an epitaxy process, chemical vapor deposition (CVD) process, plasma-enhanced chemical vapor deposition (PECVD), etch process, cleaning process, or other process carried out in a processing chamber as part of fabricating a semiconductor device, the build-up is caused on chamber components as well as in a foreline coupled to the chamber.

The inventors have discovered that build-up patterns in the foreline can be directly and/or indirectly detected by sensors used with the foreline. By collecting sensor data over multiple processing cycles, and build-up patterns, thresholds indicating an alert to a user, a foreline (or chamber) clean is needed, or that a PM is needed, may be developed using machine learning (ML) algorithms trained with training data. Identified patterns may be used by trained machine learning models to develop thresholds for providing a corrective action such as stopping operation of the processing chamber, or cleaning, or preventive maintenance (PM) should be performed on the foreline, as well as predict when these may be needed.

By providing thresholds for cleaning and PM monitored by trained ML models, clean/PM cycles may be predictively determined based on processing parameters of individual and groups of processing chambers, to more efficiently schedule factory operations. In addition, inventory of cleaning and PM-related chemicals, replacement parts, and workforce resources may be more efficiently scheduled.

Example System of Foreline Deposition Diagnostics and Control

Figure 1:
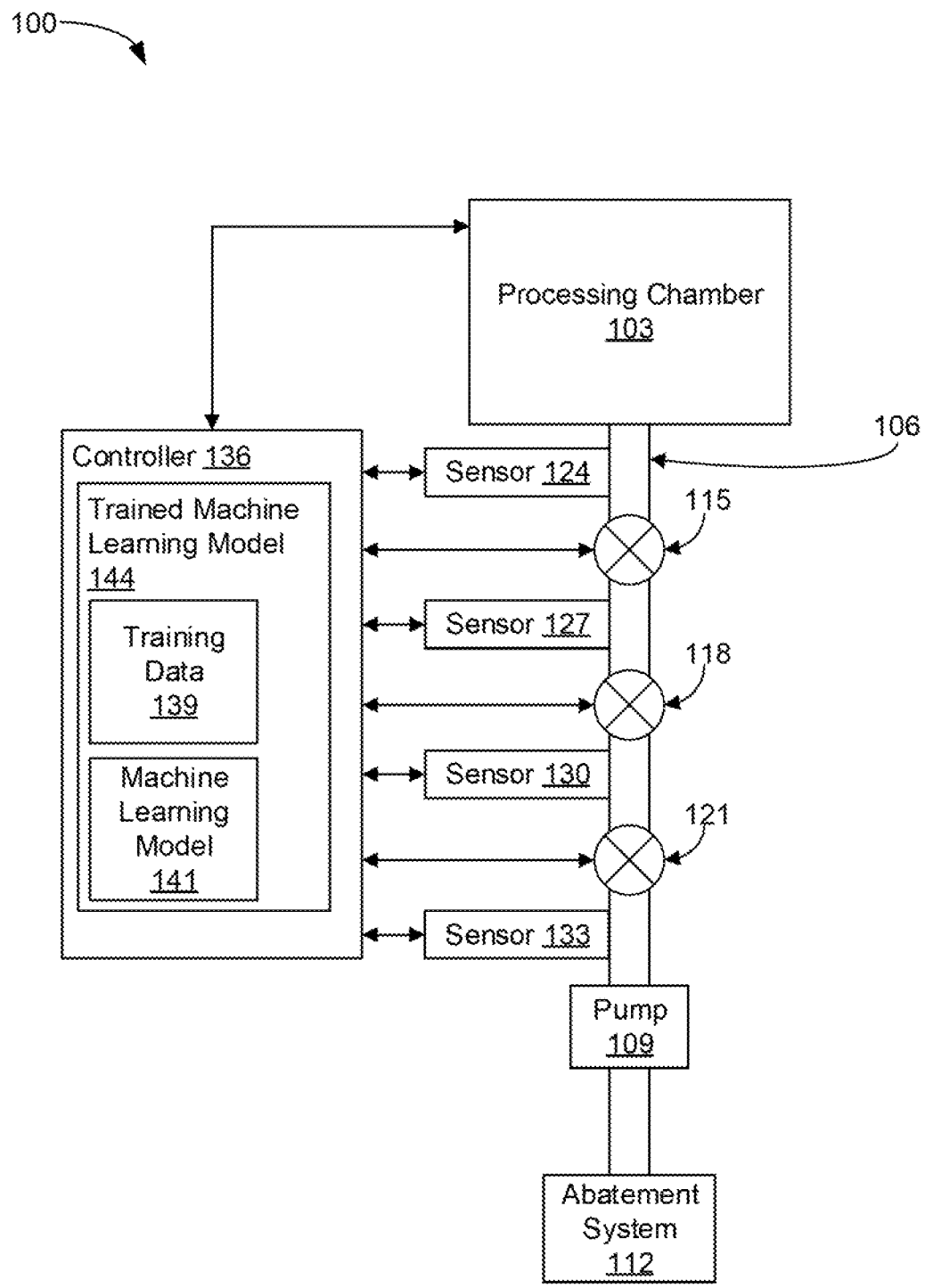
FIG. 1 depicts a system for foreline deposition and diagnostics control according to certain embodiments.

FIG. 1 depicts a system 100 for foreline deposition and diagnostics control according to certain embodiments. A processing chamber 103 is coupled to a foreline 106 via an exhaust (not shown) of the processing chamber 103, coupling the processing chamber 103 to a pump 109 that is in turn, coupled to an abatement system 112.

The processing chamber 103 may be an epitaxy chamber, a chemical vapor deposition (CVD) chamber, a plasma-enhanced CVD (PECVD) chamber, an etch chamber, a polishing station, or any processing chamber that deposits or removes one or more materials from a substrate by any means. As is understood by one of skill in the art, a processing chamber such as processing chamber 103, when used for deposition or etch, is controlled by one or more recipes governing gas and material input to the processing chamber. During the operation of processing chamber 103 materials not deposited on a substrate, or etched from a substrate, are deposited on chamber components, within the foreline 106, as well as pump 109 and abatement system 112. Systems and methods disclosed herein seek to diagnose deposition in the foreline and indicate via various algorithms and methods when a foreline clean and/or foreline preventive maintenance (PM) should be performed.

Along the length of the foreline 106 a number of valves may be positioned, serving to isolate the processing chamber 103, the pump 109, and control pressure within the foreline 106. A chamber isolation valve 115 may be located downstream from the processing chamber 103, to isolate the processing chamber 103 during foreline clean and PM operations (discussed further below). Downstream from the chamber isolation valve 115 and coupled to the foreline 106 may be a pressure control valve 118.

Pressure control valve (PCV) 118 comprises a rotating plate to control the pressure of gases in the foreline 106 by controlling the conductance of such gases and a position sensor to sense the angle of rotation of the rotating plate. The angle of the PCV 118 is an indication of the angle of the rotating plate, which as discussed below, may be used as an indicator of pressure and/or conductance within the foreline 106, and multiple measured angles may be indicators of changes in pressure and or conductance. As will be discussed below, conductance changes may be indicators of deposition build-up within the foreline 106.

Downstream from the PCV 118, the foreline 106 is coupled to a pump isolation valve 121, which isolates the pump 109 from the foreline 106. Downstream from the pump isolation valve 121, the foreline is coupled to the pump 109.

As would be appreciated by one of skill in the art, one or both of chamber isolation valve 115 and pump isolation valve 121 may, in some embodiments, be PCVs. A PCV in this context may serve as an isolation valve.

Along the foreline 106, a sensors 124-133 are interspersed along the foreline 106. Sensor 124 is located between the processing chamber 103 and the chamber isolation valve 115, sensor 127 is located between the chamber isolation valve 115 and the PCV 118, sensor 130 is located between the PCV 118 and the pump isolation valve 121, and sensor 133 is located between the pump isolation valve 121 and the pump 109.

In some embodiments, one or more of sensors 124-133 are positioned to directly or indirectly measure build-up within the foreline. In some embodiments, one or more of sensors 124-133 may be an ultrasonic sensor comprising a transducer and receiver of ultrasonic signals. An ultrasonic transducer provided as one or more of sensors 124-133 may detect build-up within the foreline 106 without having to be positioned within the foreline 106, although in some embodiments, this type of sensor could be located within the foreline 106. When positioned on the outside of the foreline 106, an ultrasonic transducer delivers an ultrasonic signal through the wall of the foreline that is coupled into an interior space of the foreline 106, such as a hollow portion of a pipe making up the foreline 106. When the foreline 106 is clean (i.e., no build-up) the ultrasonic signal may travel through the foreline 106 at the speed of sound (possibly slowed down by gases in the foreline), as detected by the receiver. However, when build-up exists in the foreline, this build-up will slow down the rate of travel of the ultrasonic signal, which increases the amount of time taken from the production of the ultrasonic signal at the transducer and receipt of this signal at the receiver. As deposition continues to build-up, the ultrasonic signal will take an increasing amount of time to reach the receiver. Moreover, different materials deposited in the foreline 106 will have different effects upon the speed of the ultrasonic signal, with the only constant being that additional deposition build-up will increasingly slow down this signal.

In some embodiments, one or more of sensors 124-133 may be a piezoelectric sensor, such as a quartz crystal microbalance (QCM) sensor. A QCM sensor is a mass sensitive piezoelectric device based on an oscillatory quartz crystal capable of detecting nanogram changes in mass to the quartz component. In embodiments, as material builds up on the quartz component, it will vibrate at a lower rate as the result of the increased mass. When placed inside the foreline 106, for example, at locations indicated by one or more of sensors 124-133, as deposition build-up occurs on the QCM sensor, the signals generated by the sensor will change in correlation with the build-up.

In some embodiments, one or more of sensors 124-133 may be a pressure sensor coupled to the foreline 106 so as to measure the pressure within the foreline 106. As material builds up in the foreline 106, pressure changes due to the same volume of gas traveling through a decreasing volume (due to build-up) of the foreline 106 may be detected as an indicator of build-up.

Although multiple embodiments of sensors 124-133 are discussed above, one of skill in the art will appreciate that one or more of sensors 124-133 may comprise multiple sensor types. For example, a sensor can include one or more of a pressure sensor, a UT sensor, and/or a QCM sensor.

In embodiments, PCV 118 may additionally be utilized as a sensor to indicate build-up in the foreline 106. In these embodiments, as build-up increases within the foreline 106, the PCV 118 may be required to increase the angle of the plate to maintain a target conductance of gases. The increase in angle, relative to previous angles, may indicate increasing build-up in the foreline 106, while a decreasing angle (e.g., after a clean or PM) may indicate less or no build-up.

One or more of the sensor types discussed above may be used in conjunction with the PCV 118 to provide data indicating increasing or decreasing build-up. For example, as sensor 127 detects a change in the build-up, the PCV 118 may respond by changing its angle. In the aggregate, these signals provide data as to how the system 100 is reacting to foreline deposition build-up.

A controller 136 is coupled to each of the sensors 124-133, as well as the PCV 118, and in some embodiments to chamber isolation valve 115 and pump isolation valve 121 as well. Controller 136 is additionally coupled to the processing chamber 103, to receive data regarding processing recipes and to provide signals to the processing chamber regarding the status of the foreline 106.

The controller 136 includes a trained machine learning (ML) model 144, comprising training data 139, and an ML model 141. Training data 139 is comprised of data (e.g., features) related to processing in the processing chamber 103, such as recipe data, and processing chamber sensor data generated by one or more processing chamber sensors during processing operations, including time-series data regarding these. Training data 139 may be stored in a database, or other data storage system. Training data further comprises data from one or more of sensors 124-133 (i.e., data regarding at least one of build-up for build-up sensors, and pressure for pressure sensors), PCV 118, chamber isolation valve 115, and pump isolation valve 121 (e.g., conductance rates, angle data, and the like), that are either direct or indirect indicators of build-up in the foreline 106, including time series representations of build-up. In some embodiments, training data 139 may include operational data from pump 109. Training data may be time-series data from each aforementioned data source, indicating differences in operational data of each data source over time. In some embodiments, training data may be historical data, synthetic data, data created by developers for purposes of training, or some combination of these. In some embodiments, training data may be grouped based on processing chamber recipes, materials that may be deposited in the foreline 106, deposition properties of deposition materials, or any other grouping suitable for training ML model 141. Training data 144 may further include data received from the sensors and valves in situ, and training the ML model 141 in real-time, providing a continuously updated trained ML model 144.

From training data 144, one or more parameters of the foreline 106 may be estimated or inferred by the trained ML model 141. For example a rate of deposition of materials in the foreline 106 may be derived from time-of-flight data of an ultrasonic signal as detected by an ultrasonic sensor, a rate of shift in resonance frequency of a QCM sensor, or the rate of change in differential pressure across a segment of the foreline 106 from one or more pressure sensors. A deposition rate within one or more segments of the foreline 106 may be inferred/estimated by the trained ML model 141 and treated as a measure for making decisions against previously measured deposition rates, or compared against one or more thresholds. Another example parameter of the foreline 106 that may be estimated or inferred by the trained ML model 141 is the health (e.g., conductance capability) of the foreline 106. The trained ML model 141 may estimate/infer a partially clogged versus a healthy condition from a combination of position of PCV 118 and temperature of the foreline 106 at the PCV 118, and a signal from an ultrasonic, QCM, or other sensor. The inferred/estimated condition may be compared to previously measured conditions of the foreline 106, or one or more thresholds, to determine that the foreline 106 is healthy or not (i.e., conducts gas at a level appropriate for operating the foreline), or is in need of a clean or PM.

In some embodiments, the ML model 141 may be trained for a particular processing recipe performed by the processing chamber, for particular materials being deposited in the foreline, or a combination of these.

ML model 141 may be a supervised or unsupervised ML model or a combination of these. In embodiments where ML model 141 is a supervised model, a support vector machine (SVM) may be used, regression model, or any supervised learning model capable of receiving training data 139 and providing a continuous output indicative or predictive, of deposition level in the foreline 106. In embodiments where ML model is an unsupervised model, a neural network may be used, or any unsupervised learning model capable of receiving training data 139 to train ML model 141 to provide clustered, or classified, output indicative, or predictive, of deposition build-up in the foreline 106.

During training, ML model 141 is trained to develop one or more thresholds of build-up in the foreline 106 based on training data 139, the thresholds indicating that a foreline clean is needed, PM is needed, or some other indicator. A threshold in this context may be a level of deposition in the foreline 106, a rate of deposition in the foreline 106, clogged/partially clogged vs healthy (sufficiently open) foreline 106, as determined by data provided by one or more sensors in the foreline 106. For example, given a recipe for a processing chamber and conditions for a foreline needed for proper processing of a substrate using the recipe, training data from the recipe, processing chamber, and foreline sensors may be compiled over time. This training data is used to train the ML model to identify one or more thresholds for proper operation of the systems, that, if met or exceeded, indicate a need to clean or PM the foreline. Once trained, the trained ML model may receive 'live' processing data to provide indicators when foreline conditions need cleaning or PM. In this context, an indicator may be a one or more classifications from an unsupervised model meeting or exceeding a threshold region, signaling a clean is needed. In a supervised model the need for a clean may be indicated when one or more dimensions of the model meets or exceeds a threshold value. Moreover, the trained ML model may predictively indicate when a clean or PM is needed, to enable efficient scheduling of resources and factory operations.

In certain embodiments, the trained ML model 144, may predict a given deposition build-up in the foreline 106 at a given time, based on a given recipe and related process parameters, as a result of training the ML model 141 with the training data. In predictive embodiments, the controller may predict when a foreline 106 clean, or PM, is to be performed, for example, to accommodate factory scheduling, the processing chamber 103 maintenance schedule, and inform resource purchase and delivery decisions.

In some embodiments, controller 136 is an open-loop controller comprising thresholds for sensor and valve data indicating when a clean, PM, or other action is to be performed. In additional embodiments, controller 136 may be a combination of open-loop control methods and trained machine learning model 144.

In operation, one or more of sensors 124-133, valves 115-121, and in some embodiments process chamber 103, provide process data to the trained ML model 144. The trained ML model 144 receives these inputs, processes them according to the trained machine learning model, and provides one or more outputs, and when the output reaches or exceeds the one or more thresholds, generates an indicator that a foreline clean or PM is to be performed. In some embodiments, the controller 136 may isolate the processing chamber from the foreline 106 and provide a signal to a cleaning system to perform a foreline clean (discussed further below), or provide an indicator to a user of the system 100 to have the clean performed.

Figure 2:
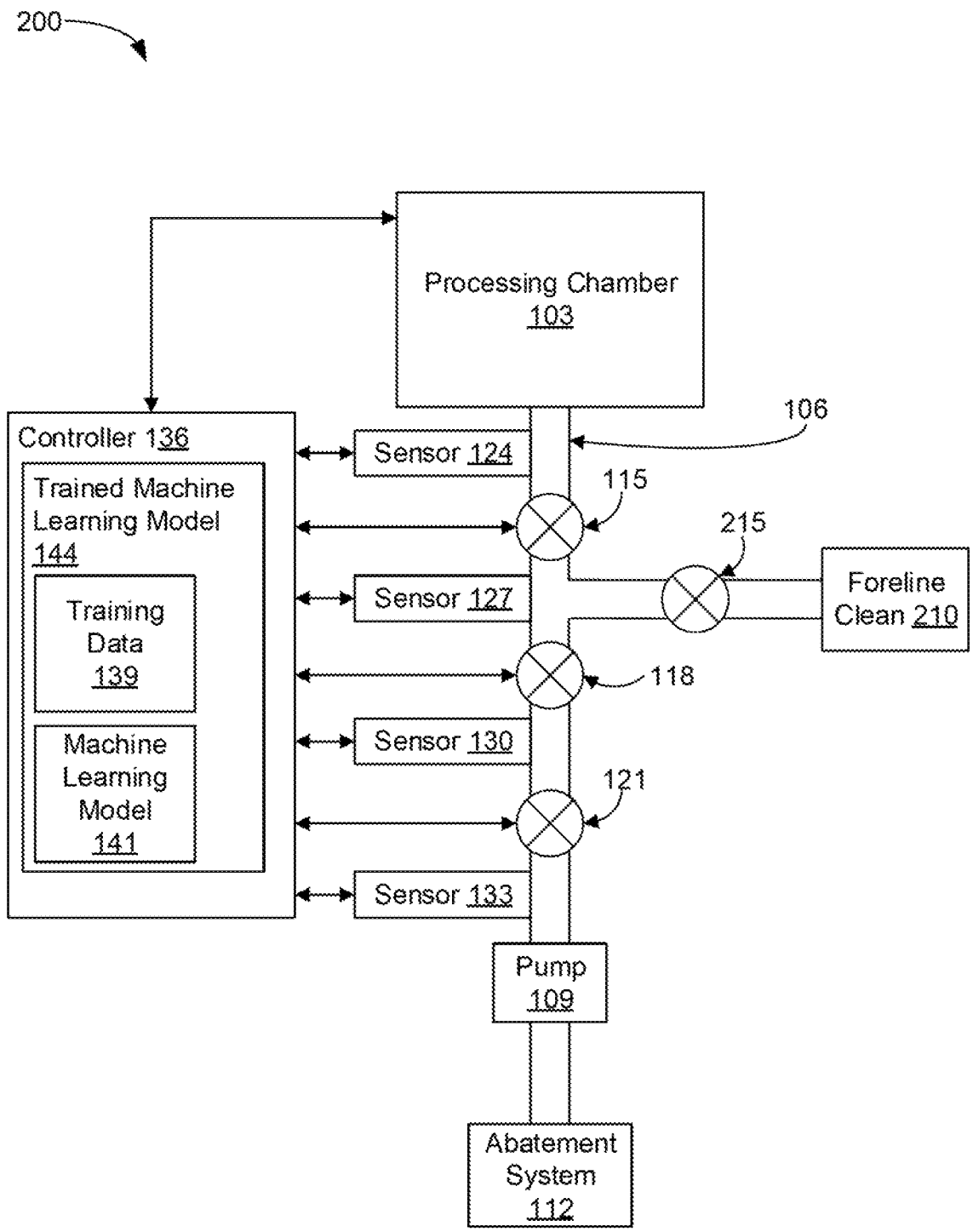
FIG. 2 depicts a system for foreline deposition and diagnostics control that includes a foreline clean system, according to certain embodiments.

Example System of Foreline Deposition Diagnostics and Control with RPS Foreline Cleaning System FIG. 2 depicts a system 200 for foreline deposition and diagnostics control that includes a foreline clean system, according to certain embodiments. System 200 is similar to system 100, with the addition of a foreline clean 210 system, a foreline clean isolation valve 215, and modifications discussed below. In some embodiments, foreline clean 210 is similar to the foreline clean system disclosed in U.S. Pat. No. 10,500,614 "TEMPERATURE CONTROLLED REMOTE PLASMA CLEAN FOR EXHAUST DEPOSIT REMOVAL," by Hilkene, et al., issued to Applied Materials of Santa Clara, CA, Dec. 10, 2019, the full disclosure of which is incorporated by reference herein, in its entirety.

In embodiments of the foreline deposition diagnostics and control that include the foreline clean 210, one or more of sensors 124-133 may include a thermal sensor. In some embodiments, foreline clean 210 includes a remote plasma source (RPS) for developing a plasma and providing the plasma to the foreline 106 for removing build-up. In some embodiments, the RPS generates a plasma from $NF_3$ and Argon gas mixture. As the plasma reaction with build-up in the foreline 106 may cause an exothermic reaction, heat generated during the clean process may be an indicator of the amount of build-up remaining in the foreline 106. As the build-up is removed due to reaction with the plasma, the amount of heat generated decreases, until a negligible amount of heat is generated, indicating that the clean cycle is complete.

In the embodiment of FIG. 2, the trained ML model 144 may further include parameters and thresholds for monitoring build-up in the foreline during a clean cycle carried out by the foreline clean 210. Training data 139 to develop parameters and thresholds includes data from thermal sensors included in one or more of sensors 124-133. This training data 139 is provided to train ML model 141, to produce trained ML model 144.

Example Method for Foreline Diagnostics and Control

Figure 3:
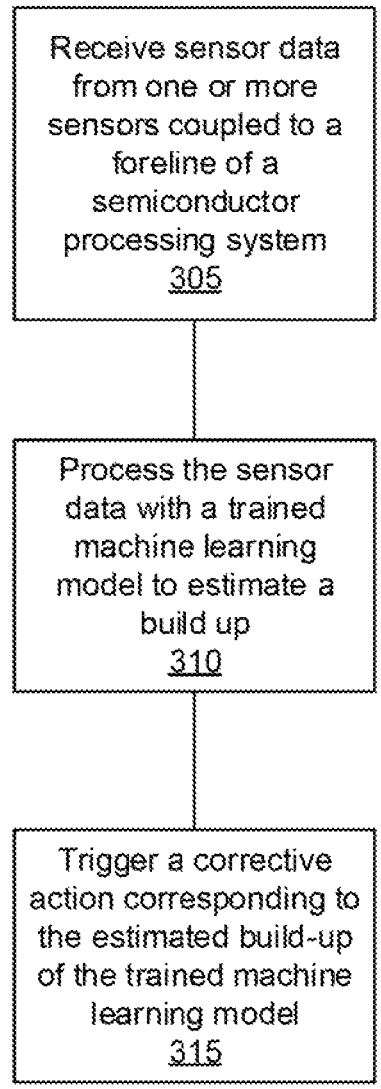
FIG. 3 depicts a method for foreline diagnostics and control, according to certain embodiments.

FIG. 3 depicts a method 300 for foreline diagnostics and control, according to certain embodiments.

At 305, the method 300 receives sensor data from one or more sensors coupled to a foreline of a semiconductor processing system, while at 310, the method 300 processes the sensor data with a trained machine learning model to estimate a build-up in the foreline. In embodiments, the trained machine learning model is trained via a process of receiving sensor training data from a database comprising sensor data from prior operation of one or more semiconductor processing systems, classifying the sensor training data to differentiate between one of a clean surface of the foreline and one of multiple deposition thicknesses of a material deposited on the foreline and generating model parameters for the trained machine learning model based on the classifying. In some embodiments, the trained machine learning model is further trained to detect a change in temperature of the foreline. It should be understood that classifying in this context may relate to supervised ML or unsupervised ML.

At 315, the method 300 triggers a corrective action corresponding to the estimated build-up of the trained machine learning model. The corrective action may comprise one or more of stopping operation of the processing system, initiating a clean operation in the semiconductor processing system or foreline, or alerting a user to conduct preventive maintenance on the semiconductor processing system or foreline. The signal may be generated in response to when the trained machine learning model indicates that a threshold is met or exceeded.

Example Processing System for Foreline Diagnostics and Control

Figure 4:
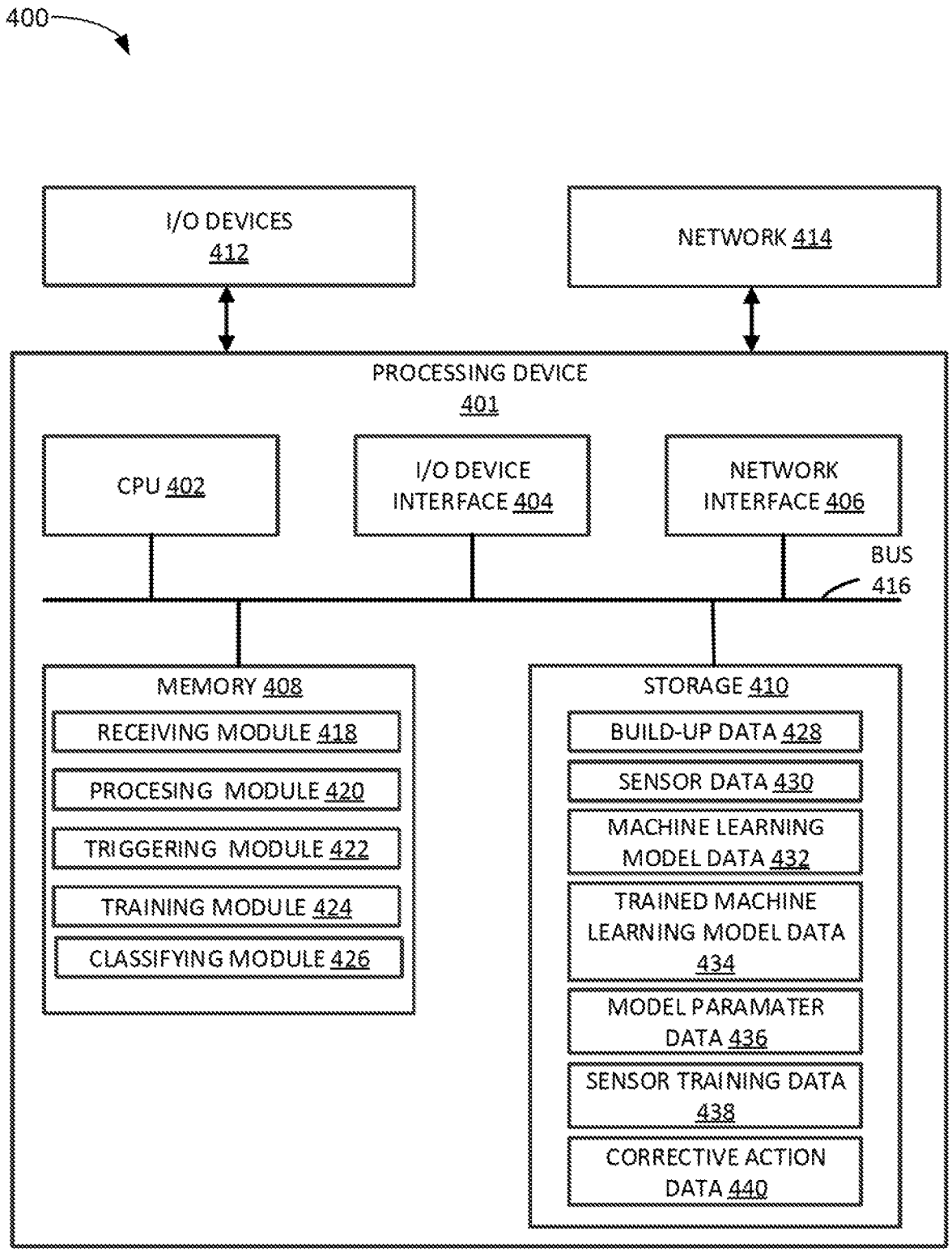
FIG. 4 is a processing system for carrying out a method for foreline diagnostics and control, according to certain embodiments.

FIG. 4 depicts a processing system 400 for foreline diagnostics and control, according to certain embodiments that may perform the methods described herein, such as a method for foreline diagnostics and control of FIG. 3, and systems capable of carrying out such method, described with respect to FIGS. 1 and 2.

Processing device 401 of the processing system 400 includes a central processing unit (CPU) 402 connected to a data bus 416. CPU 402 is configured to process computer-executable instructions, e.g., stored in non-transitory memory 408 or storage 410, and to cause the processing system 400 to perform methods described herein, for example, with respect to FIG. 3. CPU 402 is included to be representative of a single CPU, multiple CPUs, a single CPU having multiple processing cores, and other forms of processing architecture capable of executing computer-executable instructions.

Processing system 400 further includes input/output (I/O) device(s) 412 and interfaces 404, which allows processing device 401 to interface with input/output devices 412, such as, for example, semiconductor processing systems and related support systems, keyboards, displays, mouse devices, pen input, and other devices that allow for interaction with processing system 400. Note that processing system 400 may connect with external I/O devices through physical and wireless connections (e.g., an external display device).

Processing device 401 further includes a network interface 406, which provides processing system 401 with access to external network 414 and thereby external computing devices.

Processing device 401 further includes memory 408, which in this example includes a receiving module 418, processing module 420, triggering module 422, and training module 424, and classifying module 426, for performing operations described in FIG. 3, that may be carried out on systems depicted in FIGS. 1 and/or 2. While not depicted in FIG. 4, other aspects may be included in memory 408.

Note that while shown as a single memory 408 in FIG. 4 for simplicity, the various aspects stored in memory 408 may be stored in different physical memories, including memories remote from processing system 400, but all accessible by CPU 402 via internal data connections such as bus 416.

Storage 410 includes build-up data 428, sensor data 430, ML model data 432, trained ML learning model data 434, model parameter data 436, sensor training data 438, and corrective action data 440, as described in connection with FIGS. 1-3. While not depicted in FIG. 4, other aspects may be included in storage 410.

As with memory 408, a single storage 410 is depicted in FIG. 4 for simplicity, but various aspects stored in storage 410 may be stored in different physical storages, but all accessible to CPU 402 via internal data connections, such as bus 416 or external connection, such as network interfaces 406. One of skill in the art will appreciate that one or more elements of processing system 400 may be located remotely and accessed via a network 414.

Additional Considerations

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

While the foregoing is directed to embodiments of the present disclosure, other and further embodiments of the disclosure may be devised without departing from the basic scope thereof, and the scope thereof is determined by the claims that follow.

What is claimed is:

1. A system for foreline diagnostics and control, comprising:
   a foreline coupled to an exhaust of a processing chamber;
   a sensor positioned to measure deposition build-up in the foreline; and
   a build-up monitor coupled to the first sensor, the build-up monitor comprising a trained machine learning (ML) model and configured to generate an output indicating deposition build-up and trigger a corrective action when the indicated deposition build-up is at or above a build-up threshold, wherein the trained ML model is trained via a process comprising:

receiving sensor training data from a database comprising sensor data from prior operation of a semiconductor processing chamber;

classifying the sensor training data to differentiate between a clean surface of the foreline and a deposition thickness of a material deposited on the foreline; and generating model parameters for the trained machine learning model based on the classifying.

2. The system of claim 1, the sensor comprising:
an ultrasonic transducer;
a piezoelectric sensor;
a pressure sensor; or
a position sensor for a pressure control valve.

3. The system of claim 1 wherein the build-up monitor comprises an open loop control.

4. The system of claim 1 wherein the build-up monitor is coupled to a plurality of sensors.

5. The system of claim 1, wherein the corrective action comprises one or more of generating an alert to a user, stopping operation of the semiconductor processing chamber, or causing the semiconductor processing chamber to begin a clean operation.

6. The system of claim 5, wherein the trained machine learning model is further configured to monitor a change in temperature of the foreline during the clean operation.

7. The system of claim 1, wherein the semiconductor processing chamber is the processing chamber.

8. A non-transitory computer-readable medium comprising instructions for executing a method for foreline deposition diagnostics, the method comprising:

receiving sensor data from at least one of a plurality of sensors;

providing the sensor data to a build-up monitor comprising a trained machine learning (ML) model configured to generate an output indicating deposition build-up, wherein the trained ML model is trained via a process comprising:

receiving sensor training data from a database comprising sensor data from prior operation of a semiconductor processing chamber;

classifying the sensor training data to differentiate between a clean surface of the foreline and a deposition thickness of a material deposited on the foreline; and generating model parameters for the trained machine learning model based on the classifying; and generating a corrective action based on the output when the sensor data is indicated to be at or above a build-up threshold.

9. The non-transitory computer-readable medium of claim 8, wherein the plurality of sensors comprises one or more of an ultrasonic transducer or a piezoelectric sensor.

10. The non-transitory computer-readable medium of claim 8, wherein the plurality of sensors comprises a pressure sensor and a pressure control valve.

11. The non-transitory computer-readable medium of claim 10, wherein the pressure sensor is positioned adjacent to the pressure control valve.

12. The non-transitory computer-readable medium of claim 8, wherein the plurality of sensors are positioned between a pump and a chamber exhaust.

13. The non-transitory computer-readable medium of claim 12, wherein the trained machine learning (ML) model comprises one or more of a supervised model or an unsupervised model.

14. The non-transitory computer-readable medium of claim 8, wherein the corrective action is at least partially generated by an open loop control configured to monitor the sensor data.

15. The non-transitory computer-readable medium of claim 8, wherein the trained machine learning (ML) model comprises one or more of a supervised model or an unsupervised model.

16. A method for monitoring deposition build-up in a foreline of a processing system, comprising:

receiving sensor data from one or more sensors coupled to a foreline of a processing system;

processing the sensor data with a trained machine learning model to estimate a build-up, wherein the trained ML model is trained via a process comprising:

receiving sensor training data from prior operation of one or more processing systems;

classifying the sensor training data to differentiate between a clean surface of the foreline and a deposition thickness of a material deposited on the foreline; and generating model parameters for the trained machine learning model based on the classifying; and triggering a corrective action corresponding to the estimated build-up of the trained machine learning model.

17. The method of claim 16, wherein the trained machine learning model is further trained to detect a change in temperature of the foreline.

18. The method of claim 16, wherein the one or more sensors comprise one or more of:
an ultrasonic transducer;
a piezoelectric sensor;
a pressure sensor; or
a position sensor for a pressure control valve.

19. The method of claim 16, wherein the corrective action comprises one or more of stopping operation of the processing system, initiating a clean operation, or alerting a user.

20. The method of claim 16, wherein the one or more sensors are positioned between a pump and a chamber exhaust.

* * * * *